United States Patent
Chuang

(10) Patent No.: US 11,380,582 B2
(45) Date of Patent: Jul. 5, 2022

(54) SEMICONDUCTOR STRUCTURE AND METHOD FOR FORMING THE SAME

(71) Applicant: Winbond Electronics Corp., Taichung (TW)

(72) Inventor: Che-Fu Chuang, Pitou Township (TW)

(73) Assignee: WINBOND ELECTRONICS CORP., Taichung (TW)

( * ) Notice: Subject to any disclaimer, the term of this patent is extended or adjusted under 35 U.S.C. 154(b) by 83 days.

(21) Appl. No.: 17/061,185

(22) Filed: Oct. 1, 2020

(65) Prior Publication Data

US 2021/0159119 A1   May 27, 2021

(30) Foreign Application Priority Data

Nov. 26, 2019   (TW) .................. 108142881

(51) Int. Cl.
| | |
|---|---|
| *H01L 21/768* | (2006.01) |
| *H01L 27/11521* | (2017.01) |
| *H01L 29/66* | (2006.01) |
| *H01L 21/28* | (2006.01) |
| *H01L 21/8234* | (2006.01) |

(52) U.S. Cl.
CPC .. *H01L 21/76897* (2013.01); *H01L 21/28132* (2013.01); *H01L 21/823468* (2013.01); *H01L 27/11521* (2013.01); *H01L 29/6656* (2013.01)

(58) Field of Classification Search
CPC ......... H01L 21/76897; H01L 27/11521; H01L 21/823468
See application file for complete search history.

(56) References Cited

U.S. PATENT DOCUMENTS

2015/0194314 A1* 7/2015 Chu .................... H01L 27/1157
438/666

* cited by examiner

*Primary Examiner* — Farun Lu
(74) *Attorney, Agent, or Firm* — Muncy, Geissler, Olds & Lowe, P.C.

(57) ABSTRACT

A method for manufacturing a semiconductor device is provided. The method includes the following steps: forming a lining layer on a substrate and a plurality of gate structures; forming a first spacer layer on the lining layer; forming a stop layer on the first spacer layer; forming a first sacrificial layer on the stop layer and between the gate structures; removing a portion of the first sacrificial layer so that the top surface of the first sacrificial layer is located between the upper portions of the gate structures; forming a second spacer layer on the first sacrificial layer and the gate structures; and removing a portion of the second spacer layer so that the remaining second spacer layer is located between the upper portions of the gate structures.

20 Claims, 13 Drawing Sheets

SEMICONDUCTOR STRUCTURE AND METHOD FOR FORMING THE SAME

CROSS REFERENCE TO RELATED APPLICATIONS

This application claims priority of Taiwan Patent Application No. 108142881, filed on Nov. 26, 2019, the entirety of which is incorporated by reference herein.

BACKGROUND OF THE INVENTION

Field of the Invention

The present disclosure relates to a semiconductor structure and a method for forming the same, and in particular it relates to a self-aligned contact and a method for forming the same.

Description of the Related Art

As the size of integrated circuits is reduced, the distance between the self-aligned contact structure and the gate structure becomes smaller. This increases the probability of leakage current due to a short circuit. In the traditional method of manufacturing self-aligned contact structures, sidewall spacers of the gate structure may be damaged when forming the self-aligned contact structure. Such incomplete sidewall spacers may not be able to effectively isolate the self-aligned contact structure from the gate structure, and leakage current may occur between the gate structure and the self-aligned contact structure.

Although existing self-aligned contact structures have been adequate for their intended purposes, they have not been entirely satisfactory in all respects. Therefore, the development of a process that can further improve the yield of the self-aligned contact structure is still one of the goals that the industry is aiming at.

BRIEF SUMMARY OF THE INVENTION

In accordance with some embodiments of the present disclosure, a method for forming the semiconductor structure is provided. The method includes the following steps: providing a substrate; forming a plurality of gate structures on the substrate; forming a lining layer on the substrate and the plurality of gate structures; forming a first spacer layer on the lining layer; forming a stop layer on the first spacer layer; forming a first sacrificial layer on the stop layer and between the plurality of gate structures; removing a portion of the first sacrificial layer so that the top surface of the first sacrificial layer is located between the upper portions of the gate structures; forming a second spacer layer on the first sacrificial layer and the plurality of gate structures; removing a portion of the second spacer layer so that the remaining second spacer layer is located between the upper portions of the gate structures; forming a second sacrificial layer on the plurality of gate structures and between the gate structures; removing the first sacrificial layer and the second sacrificial layer, and removing portions of the lining layer, the first spacer layer, and the stop layer to form a plurality of contact openings between the gate structures, wherein the contact openings expose a part of the surface of the substrate; and filling a conductive material into the contact openings to form a plurality of contact plugs.

In accordance with some embodiments of the present disclosure, a semiconductor structure is provided. The semiconductor structure includes a substrate, a plurality of gate structures, a lining layer, a first spacer layer, a stop layer, a second spacer layer, and a plurality of contact plugs. The plurality of gate structures are located on the substrate. The lining layer is located on the plurality of gate structures. The first spacer layer is located on the lining layer. The stop layer is located on the first spacer layer. The second spacer layer is located on the upper portions of the gate structures and the contact plugs are located between the gate structures.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
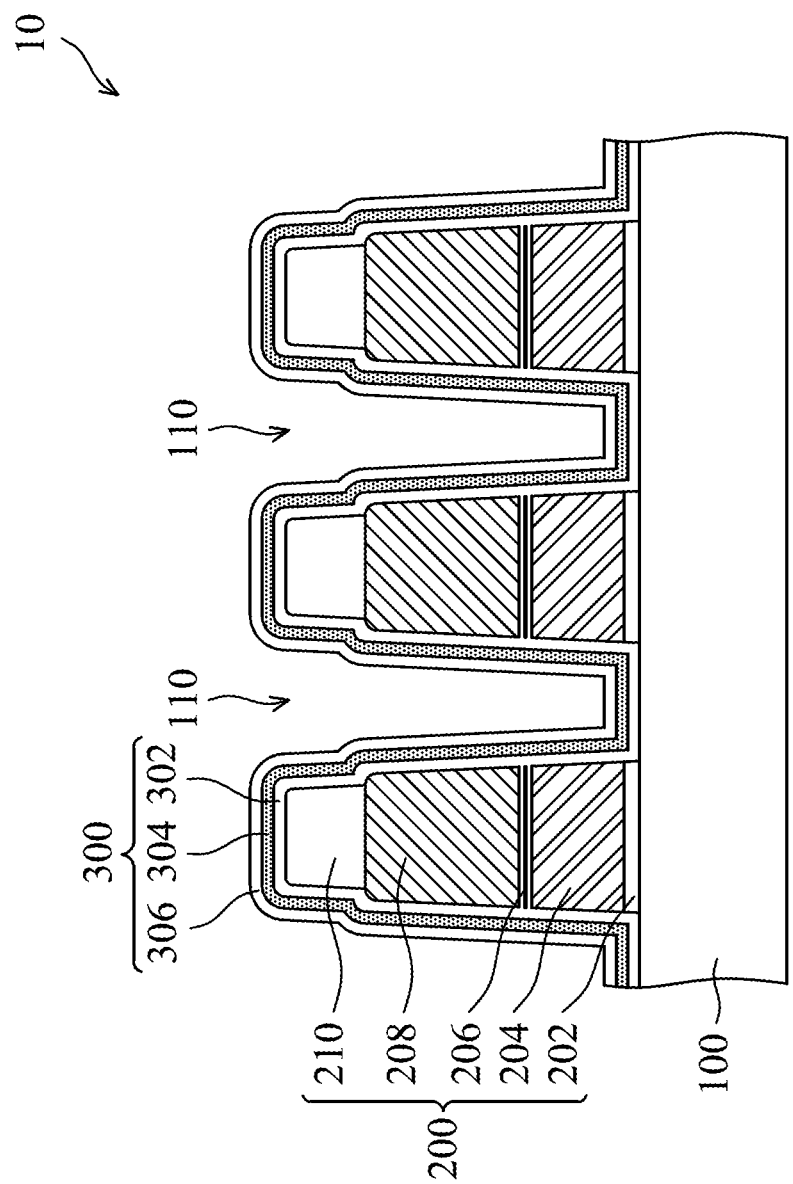
FIGS. 1A to 1M are cross-sectional diagrams of a semiconductor structure during the stages of manufacture in accordance with some embodiments of the present disclosure.

Referring to FIG. 1A, a substrate 100 may be provided first. Next, a plurality of gate structures 200 may be formed on the substrate 100. In some embodiments, the gate structures 200 may define a plurality of trenches 110.

As shown in FIG. 1A, in some embodiments, the gate structure 200 may be a stacked structure having several layers. Specifically, in accordance with some embodiments, the gate structure 200 may include a tunneling dielectric layer 202, a conductive layer 204, an inter-gate dielectric layer 206, and a conductive layer 208 that are sequentially stacked on the substrate 100.

In some embodiments, the conductive layer 204 may function as a floating gate. In some embodiments, the conductive layer 208 may function as a control gate.

In some embodiments, the material of the tunneling dielectric layer 202 may include silicon oxide. In some embodiments, the material of the conductive layer 204 may include doped polycrystalline silicon, undoped polycrystalline silicon, or a combination thereof. In some embodiments, the material of the inter-gate dielectric layer 206 may include a composite layer composed of oxide layer/nitride layer/oxide layer (ONO), such as a composite layer composed of silicon oxide/silicon nitride/silicon oxide. Moreover, the material of the conductive layer 208 may include doped polycrystalline silicon, undoped polycrystalline silicon, or a combination thereof.

In addition, in some embodiments, the gate structure 200 may further include a gate masking layer 210, and the gate masking layer 210 may be disposed on the conductive layer 208. In some embodiments, the material of the gate masking layer 210 may include silicon oxide, silicon nitride, silicon oxynitride, or a combination thereof.

Next, as shown in FIG. 1A, a lining layer 302 may be formed on the substrate 100 and the gate structures 200, and the lining layer 302 may cover the gate structures 200 and be formed at bottoms of the trenches 110 between the gate structures 200. Specifically, in some embodiments, the lining layer 302 may be conformally formed on the substrate 100 and the gate structures 200. Furthermore, the lining layer 302 may cover the sidewalls and the top surfaces of the gate structures 200 and be in contact with the sidewalls and the top surfaces of the gate structures 200.

In an embodiment, after the step of forming the gate structure 200 and before the step of forming the lining layer 302, at least one ion implantation process may be performed to form a plurality of shallow doped regions in the substrate 100 (not illustrated).

In some embodiments, the material of the lining layer 302 may include silicon oxide. In addition, in some embodiments, the material of the lining layer 302 may be, for example, a high-temperature oxide (HTO).

Next, a first spacer layer 304 may be formed on the lining layer 302. The first spacer layer 304 may cover the lining layer 302 and the gate structures 200, and the first spacer layer 304 may also be formed at bottoms of the trenches 110 between the gate structures 200. Specifically, in some embodiments, the first spacer layer 304 may be conformally formed on the lining layer 302 and in contact with the lining layer 302. Furthermore, the first spacer layer 304 may also cover the sidewalls and the top surfaces of the gate structures 200.

In some embodiments, the material of the first spacer layer 304 may include silicon nitride, silicon oxynitride, or a combination thereof.

Next, a stop layer 306 may be formed on the first spacer layer 304. The stop layer 306 may cover the first spacer layer 304, the lining layer 302, and the gate structures 200, and the stop layer 306 may also be formed at bottoms of the trenches 110 between the gate structures 200. Specifically, in some embodiments, the stop layer 306 may be conformally formed on the first spacer layer 304 and in contact with the first spacer layer 304. Furthermore, the stop layer 306 may cover the sidewalls and the top surfaces of the gate structures 200.

In addition, in accordance with some embodiments, the aforementioned lining layer 302, the first spacer layer 304, and the stop layer 306 may serve as a spacer structure 300 of the gate structures 200. In other words, in accordance with some embodiments, the spacer structure 300 mainly includes the lining layer 302, the first spacer layer 304, and the stop layer 306.

In some embodiments, the material of the stop layer 306 may include silicon oxide.

Figure 1B:
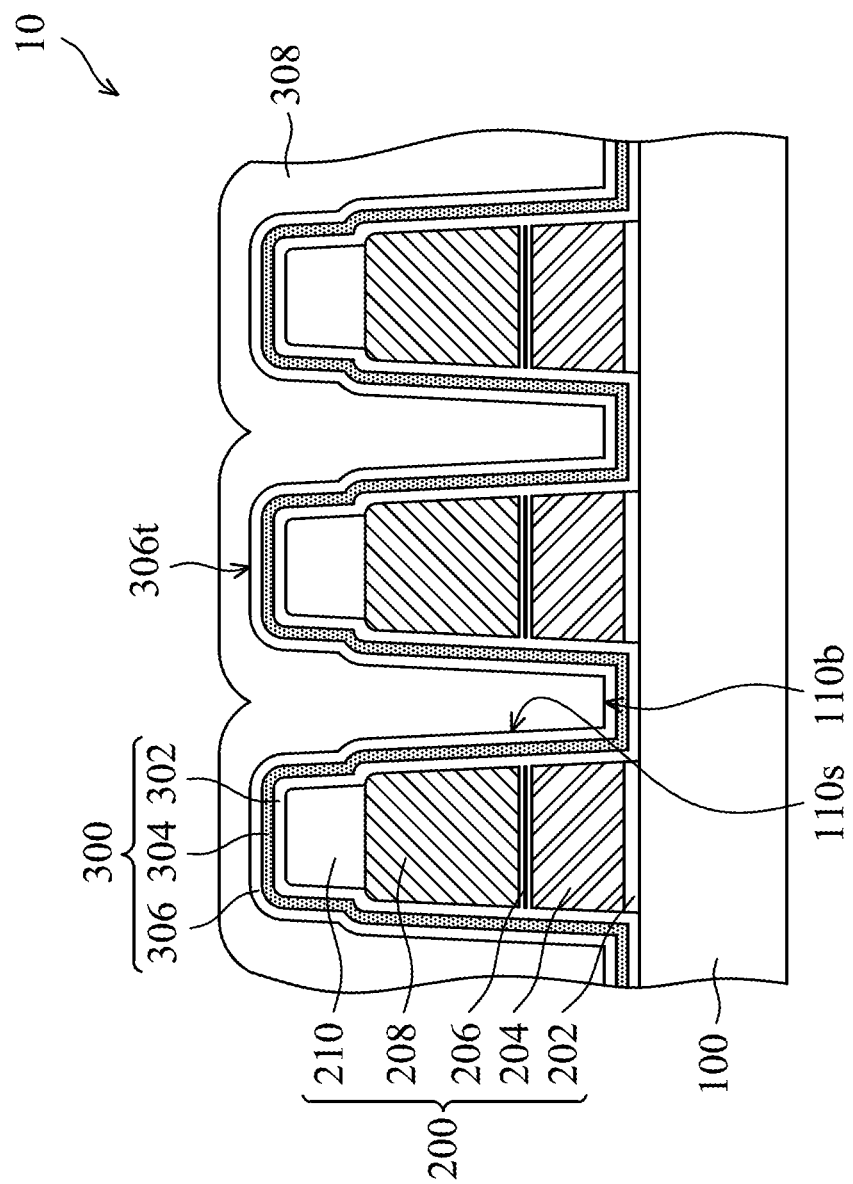

Next, referring to FIG. 1B, a first sacrificial layer 308 may be formed on the stop layer 306 and between the gate structures 200. Specifically, the first sacrificial layer 308 may cover the gate structures 200 and the aforementioned stop layer 306, the first spacer layer 304 and the lining layer 302, and the first sacrificial layer 308 may be filled in the trenches 110 and in contact with the sidewalls 110s and bottoms 110b of the trenches 110. Furthermore, the first sacrificial layer 308 may cover the sidewalls and the top surfaces of the gate structures 200. In addition, in this step, the first sacrificial layer 308 that is formed may be higher than the top surface 306t of the stop layer 306.

In some embodiments, the material of the first sacrificial layer 308 may include polycrystalline silicon.

Figure 1C:
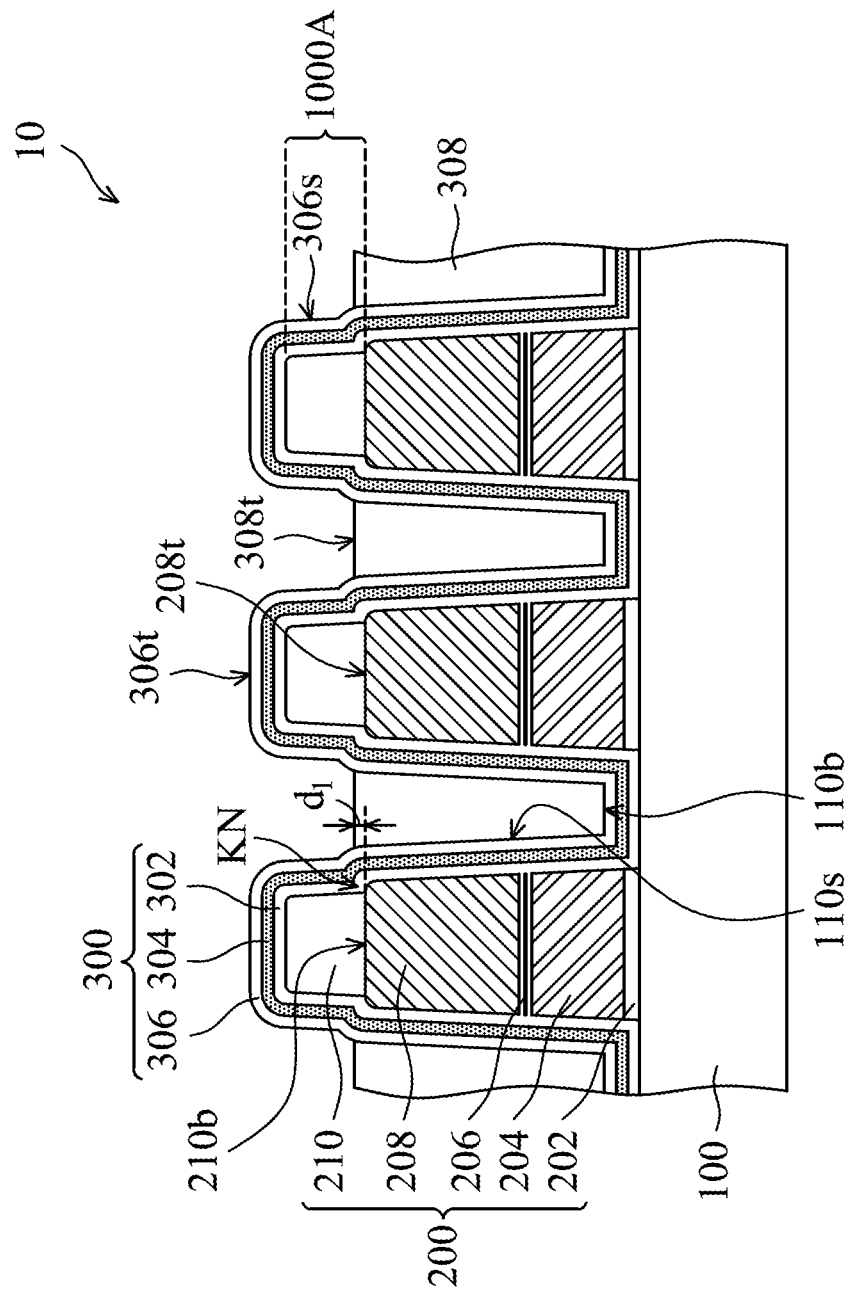

Next, referring to FIG. 1C, a portion of the first sacrificial layer 308 may be removed so that the top surface 308t of the first sacrificial layer 308 is located between upper portions 1000A of the gate structures 200. In accordance with some embodiments, the upper portion 1000A of the gate structure 200 may include the gate masking layer 210 as described above. In other words, in some embodiments, the upper portion 1000A may substantially correspond to a region of the gate masking layer 210. In accordance with some embodiments, the upper portion 1000A of the gate structure 200 may include the gate masking layer 210 and a portion of the conductive layer 208 located below the gate masking layer 210. In addition, after a portion of the first sacrificial layer 308 is removed, a portion of the top surfaces 306t and a portion of the side surfaces 306s of the stop layer 306 may be exposed.

In some embodiments, the position (or horizontal height) of the top surface 308t of the first sacrificial layer 308 may be higher than the position (or horizontal height) of the top surface 208t of the conductive layer 208. In other words, the position (or horizontal height) of the top surface 308t of the first sacrificial layer 308 may be higher than the position (or horizontal height) of the bottom surface 210b of the gate masking layer 210. Specifically, in some embodiments, the top surface 308t of the first sacrificial layer 308 and the bottom surface 210b of the gate masking layer 210 are separated by a first distance $d_1$. In some embodiments, the first distance $d_1$ may be in a range from about 250 Å to about 50 Å.

It should be noted that, in accordance with some embodiments of the present disclosure, the aforementioned first distance $d_1$ refers to the minimum distance between an extension line (not illustrated) of the top surface 308t of the first sacrificial layer 308 and an extension line (not illustrated) of the bottom surface 210b of the gate masking layer 210.

Furthermore, in some embodiments, after removing a portion of the first sacrificial layer 308, the position (or horizontal height) of the top surface 308t of the first sacrificial layer 308 may be higher than the position (or horizontal height) of a shoulder portion KN of the gate structure 200 by about the first distance $d_1$. In some embodiments, the shoulder portion KN of the gate structure 200 may substantially correspond to the top corner portion of the conductive layer 208, and the top corner portion of the conductive layer 208 usually protrudes outward from the gate masking layer 210. Specifically, the top surface 208t of the conductive layer 208 is generally larger than the bottom surface 210b of the gate masking layer 210 and therefore the gate structure 200 has protruding shoulder portions KN.

In some embodiments, a portion of the first sacrificial layer 308 may be removed using an etch-back process.

Figure 1D:
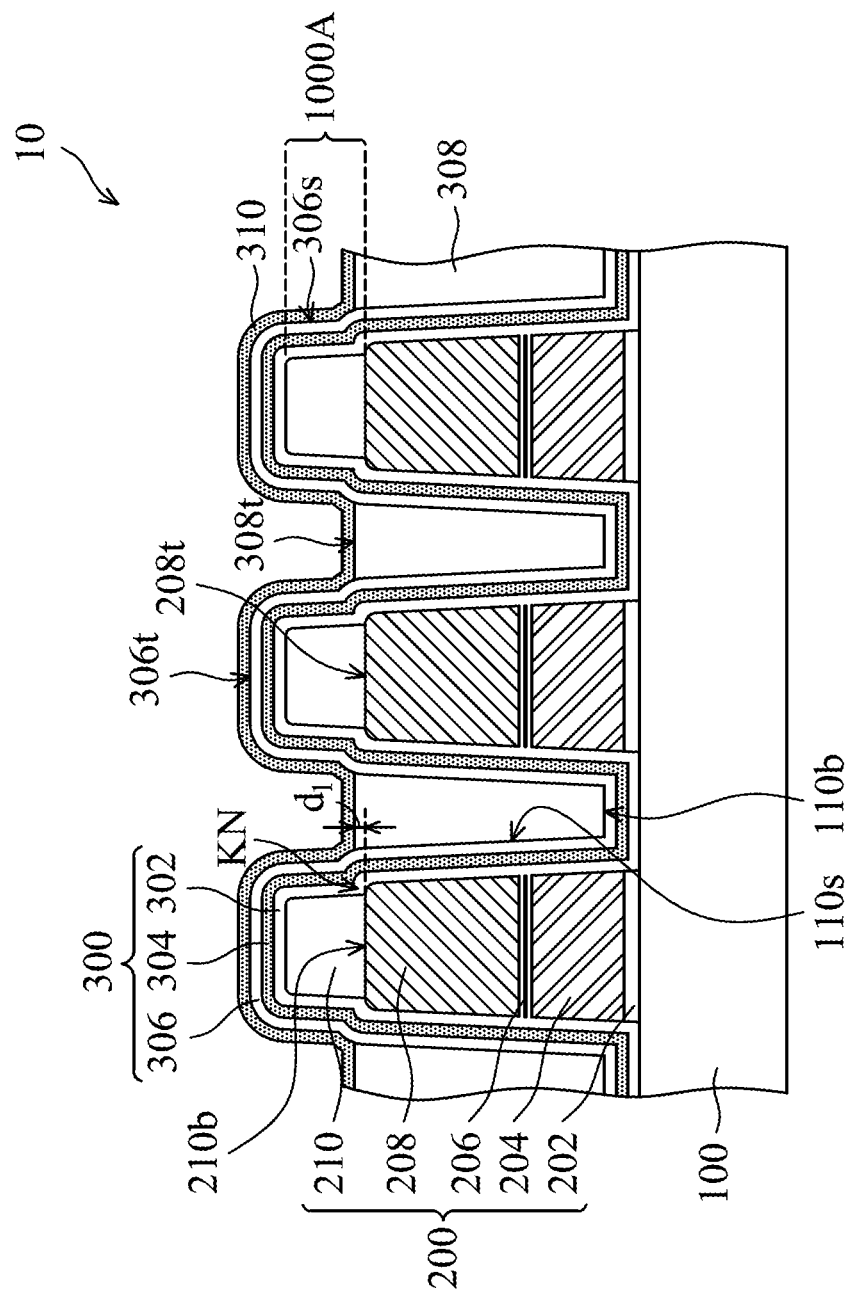

Next, referring to FIG. 1D, a second spacer layer 310 may be formed on the first sacrificial layer 308 and the gate structure 200. Specifically, the second spacer layer 310 may be conformally formed on the first sacrificial layer 308 and the gate structure 200, and the second spacer layer 310 may be in contact with the top surface 308t of the first sacrificial layer 308 and the top surface 306t and side surfaces 306s of the stop layer 306. In some embodiments, the second spacer layer 310 may substantially cover the upper portions 1000A of the gate structures 200. Furthermore, in some embodiments, the second spacer layer 310 may be substantially formed on the upper portions 1000A of the gate structures 200 while not formed on the lower portions (not labeled with numeral reference) of the gate structures 200.

In some embodiments, the material of the second spacer layer 310 may include silicon nitride, silicon oxynitride, or a combination thereof.

Figure 1E:
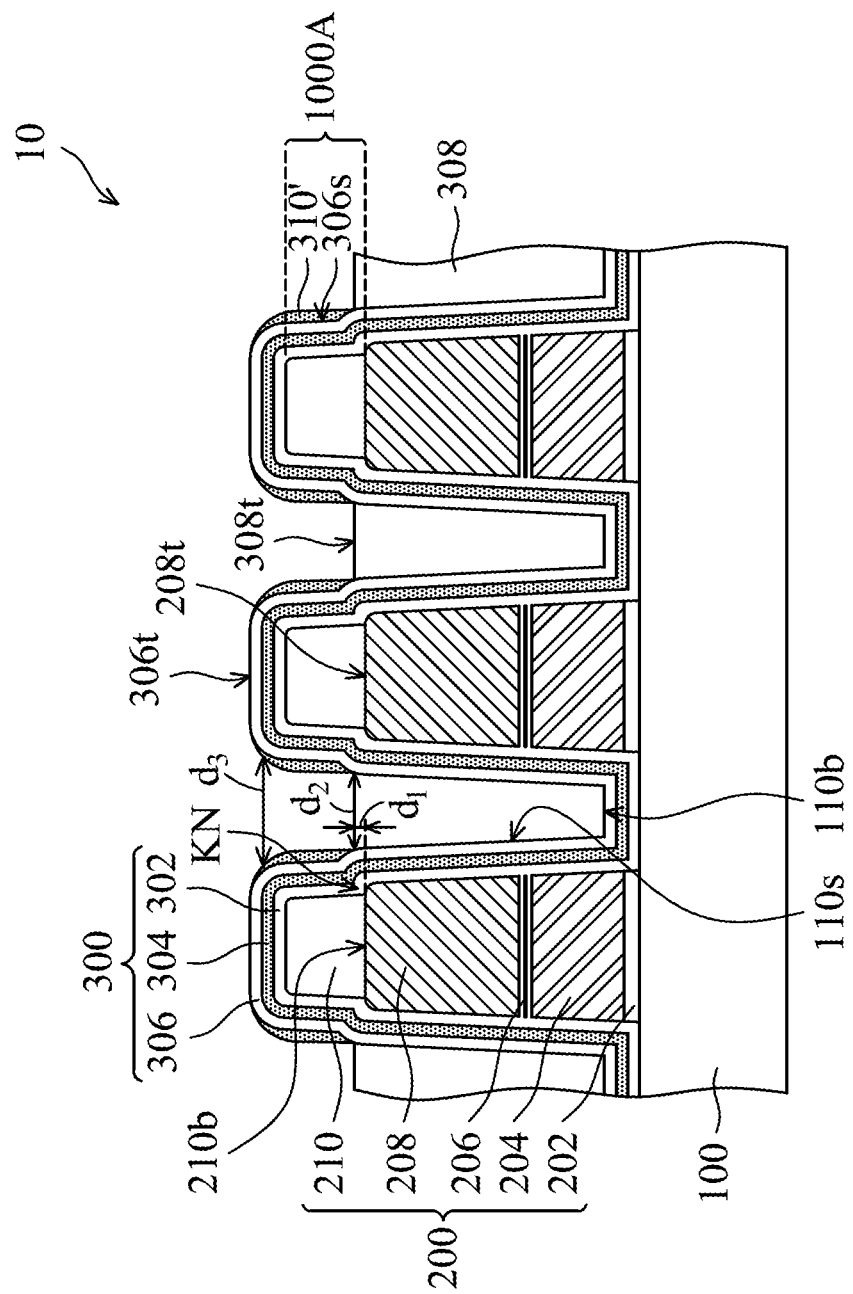

Next, referring to FIG. 1E, a portion of the second spacer layer 310 may be removed so that the second spacer layer 310' that remains is located between the upper portions 1000A of the gate structure 200. Moreover, in this step, the top surface 306t of the stop layer 306 may also be exposed. In some embodiments, after a portion of the second spacer layer 310 is removed, the remaining second spacer layer 310' may be located on a part of the side surfaces 306s of the stop layer 306. In some embodiments, the second spacer layer 310' that remains may be located on both sides of the upper portion 1000A (or may surround the upper portion 1000A) of the gate structure 200.

As shown in FIG. 1E, the second spacer layer 310' that remains may extend from the top surface 306t of the stop layer 306 to the top surface 308t of the first sacrificial layer 308. With such a configuration, the spacer structures 300 located on both sides of the upper portion 1000A of the gate structure 200 may have a flat profile. Specifically, in some embodiments, the bottoms of two adjacent remaining second spacer layers 310' are separated by a second distance $d_2$, and the tops of two adjacent remaining second spacer layers 310' are separated by a third distance $d_3$. In some embodiments, the second distance $d_2$ and the third distance $d_3$ may be substantially the same. In some embodiments, the difference between the second distance $d_2$ and the third distance $d_3$ may be less than about 20% of the third distance $d_3$, about 15% of the third distance $d_3$, about 10% of the third distance $d_3$, or about 5% of the third distance $d_3$.

Figure 1F:
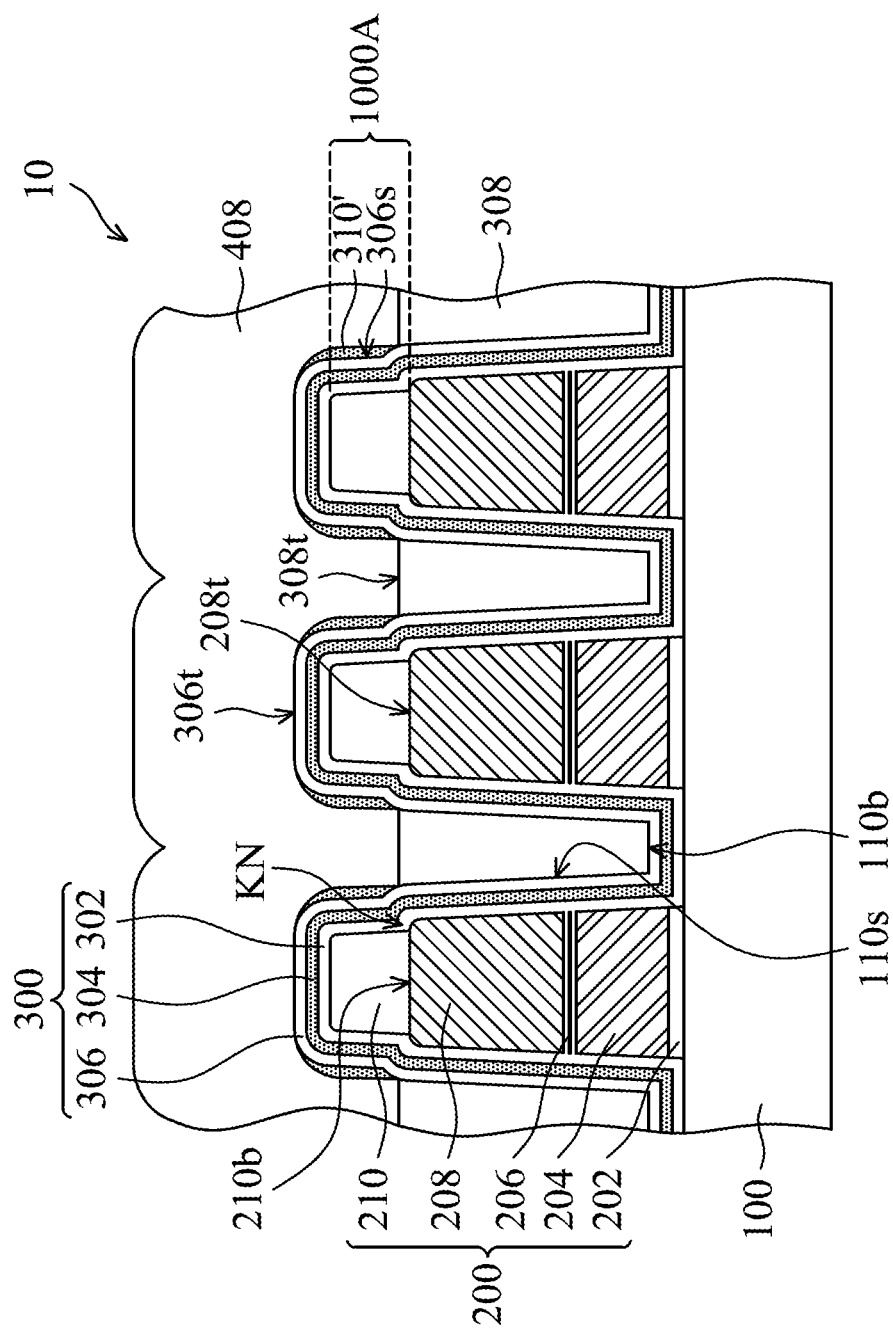

Next, referring to FIG. 1F, a second sacrificial layer 408 may be formed on the gate structures 200 and between the gate structures 200. Specifically, the second sacrificial layer 408 may cover the top surface 306t of the stop layer 306, the top surface 308t of the first sacrificial layer 308, and the second spacer layer 310' that remains. In addition, in this step, the second sacrificial layer 408 that is formed may be higher than the top surface 306t of the stop layer 306.

In some embodiments, the material of the second sacrificial layer 408 may include polycrystalline silicon. In addition, the material of the second sacrificial layer 408 may be the same as the material of the first sacrificial layer 308.

Figure 1G:
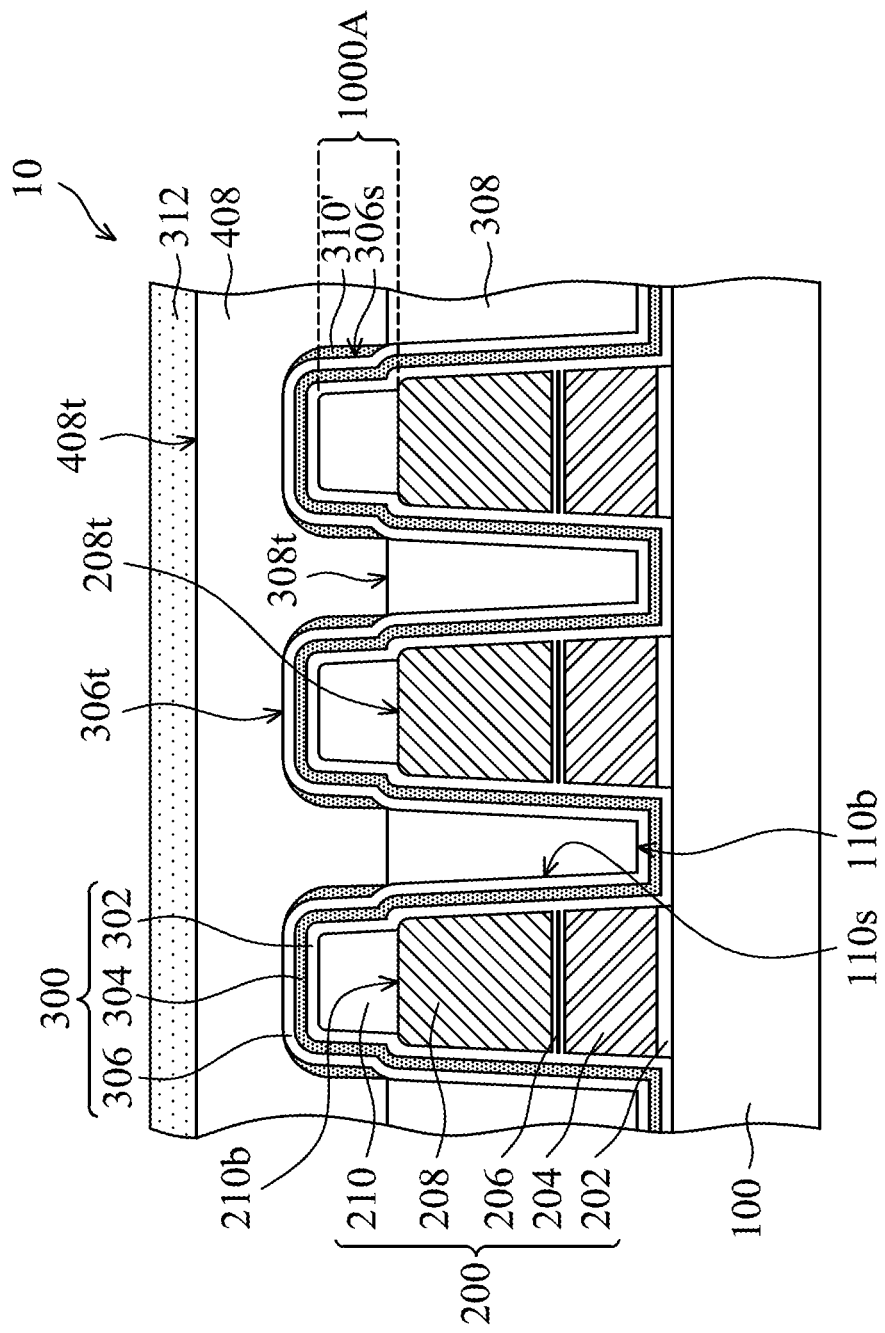

Next, referring to FIG. 1G, in some embodiments, after forming the second sacrificial layer 408 on the gate structures 200 and between the gate structures 200, a mask layer 312 may be further formed on the second sacrificial layer 408.

In some embodiments, the mask layer 312 may include silicon nitride, silicon oxide, amorphous carbon material, other suitable mask materials, or a combination thereof In addition, in accordance with some embodiments, before forming the mask layer 312 on the second sacrificial layer 408, a planarization process may be performed on the second sacrificial layer 408 so that the second sacrificial layer 408 may have a planar top surface 408t.

Figure 1H:
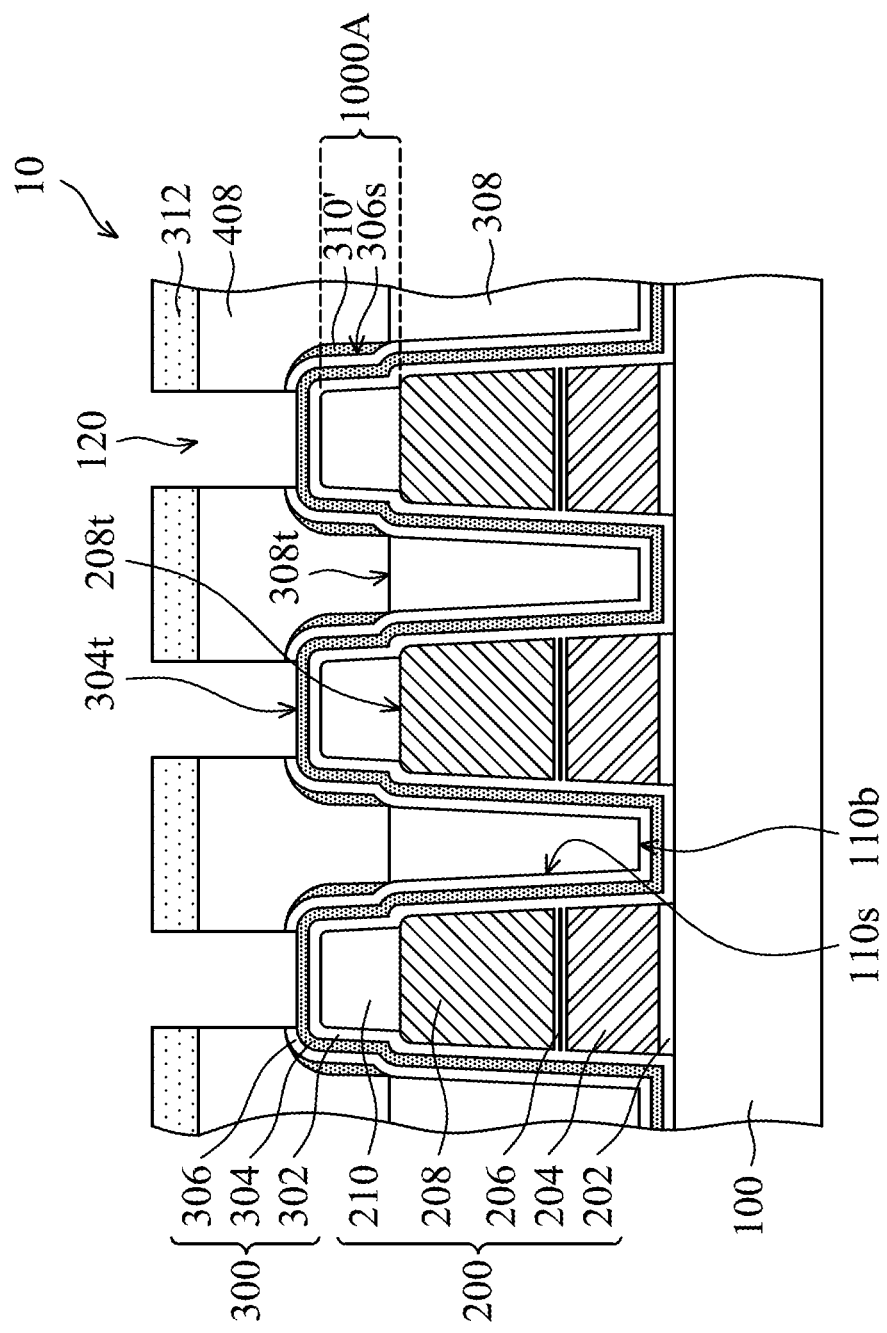

Next, referring to FIG. 1H, in some embodiments, the mask layer 312 may be patterned to remove the portions of mask layer 312 that are located above the gate structures 200. The patterned mask layer 312 may define the positions of openings 120 that are subsequently formed above the gate structures 200. Specifically, the patterned mask layer 312 may be used as a mask to remove portions of the second sacrificial layer 408 that are not masked by the mask layer 312 to form the openings 120 that penetrate through portions of the second sacrificial layer 408 that are located above the gate structures 200. In addition, the opening 120 may expose a part of the top surface 304t of the first spacer layer 304 and a portion of the stop layer 306.

In some embodiments, the portions of the mask layer 312 may be removed using a patterning process.

Furthermore, in some embodiments, the portions of the second sacrificial layer 408 may be removed using a dry etching process to form the openings 120.

Figure 1I:
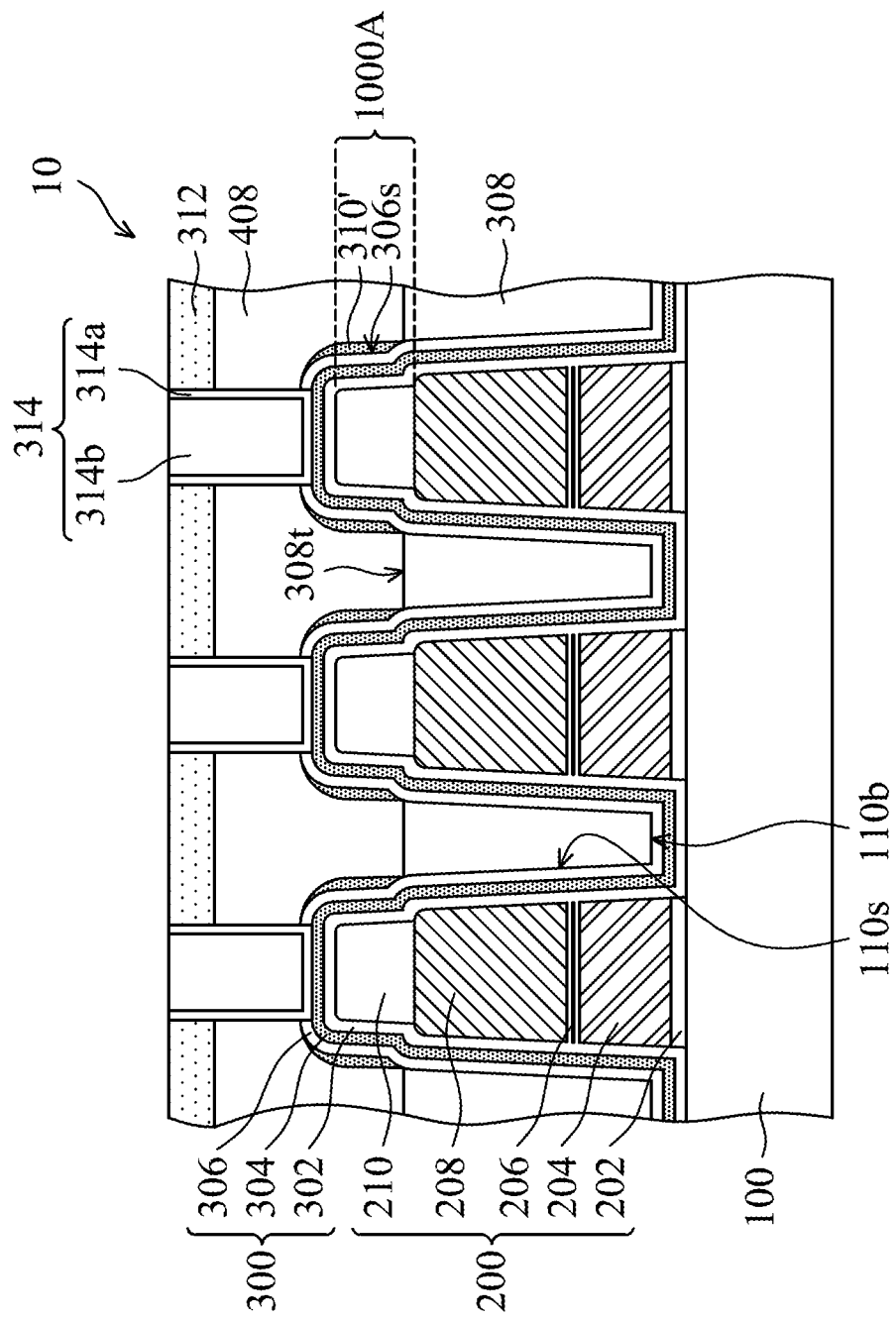

Next, referring to FIG. 1I, in some embodiments, after forming the second sacrificial layer 408 on the gate structures 200 and between the gate structures 200, a plurality of dielectric plugs 314 may be further formed above the gate structures 200, and the dielectric plugs 314 may penetrate through portions of the second sacrificial layer 408 that are located above the gate structures 200. The dielectric plugs 314 may define the positions of contact plugs that are subsequently formed, and may protect the gate structures 200 from mobile ions affecting the reliability of the device.

Specifically, in some embodiments, after forming the openings 120 located above the gate structures 200, a third spacer layer 314a may be formed on the sidewalls of the opening 120. In some embodiments, the third spacer layer 314a may be conformally formed in the opening 120. Thereafter, a dielectric material 314b may be filled in the opening 120 to form the dielectric plug 314.

In some embodiments, the material of the third spacer layer 314a may include silicon nitride, silicon oxynitride, or a combination thereof. In addition, the material of the third spacer layer 314a may be the same as or different from that of the first spacer layer 304 and the second spacer layer 310.

In some embodiments, the dielectric material 314b may include silicon oxide, silicon nitride, silicon oxynitride, other suitable dielectric materials, or a combination thereof.

Figure 1J:
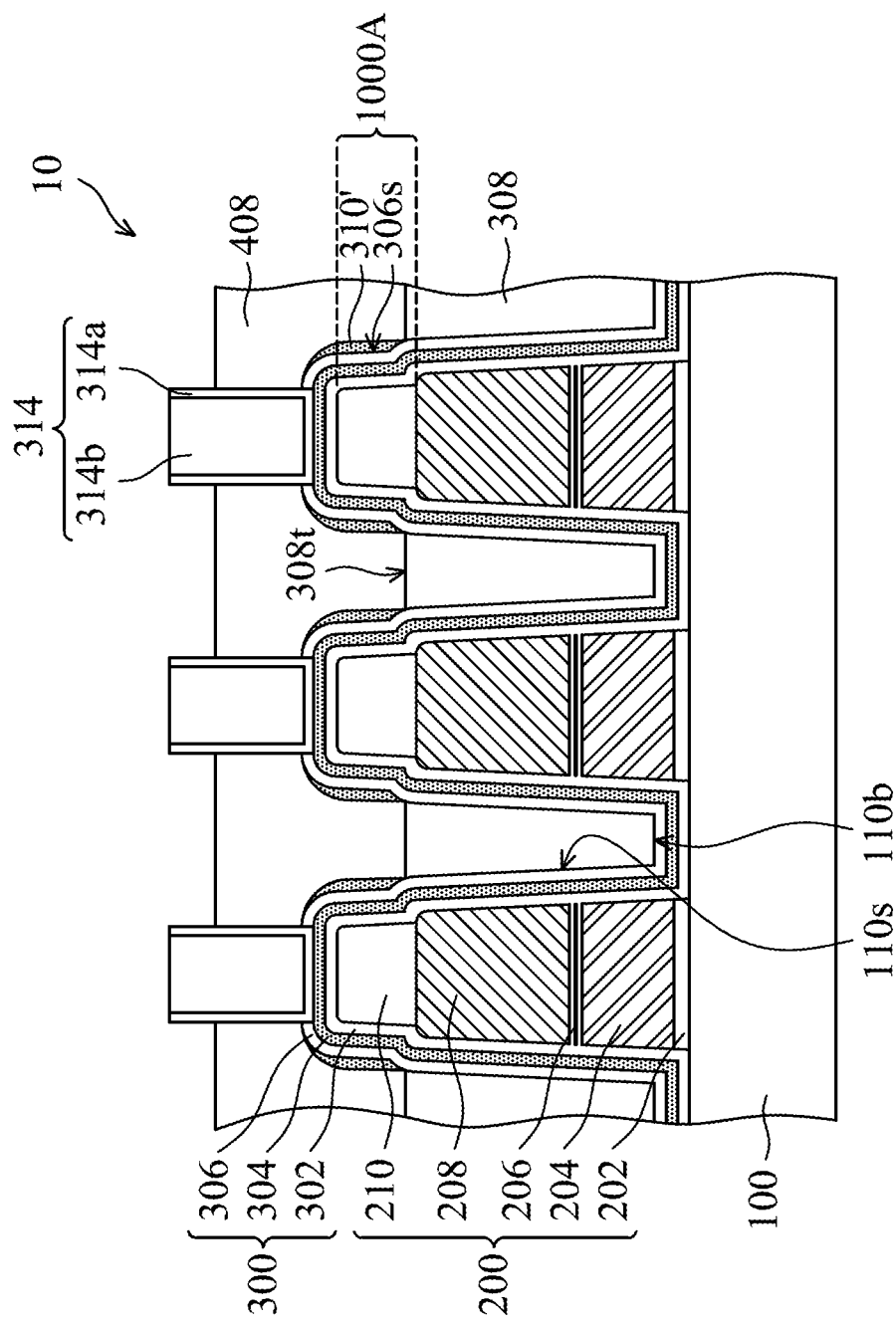

Next, referring to FIG. 1J, in some embodiments, after the dielectric plugs 314 are formed, the patterned mask layer 312 may be removed.

Figure 1K:
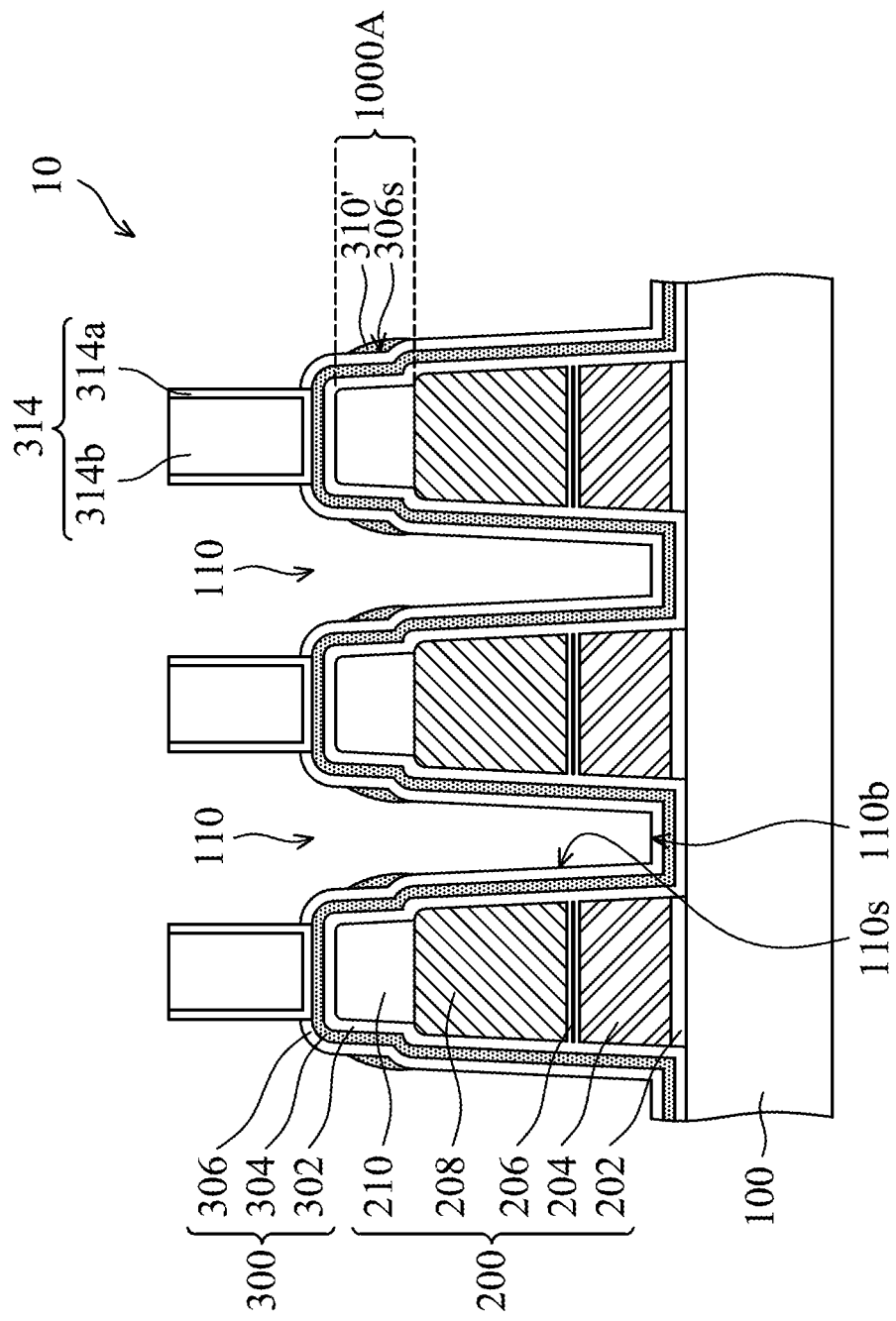
Figure 1L:
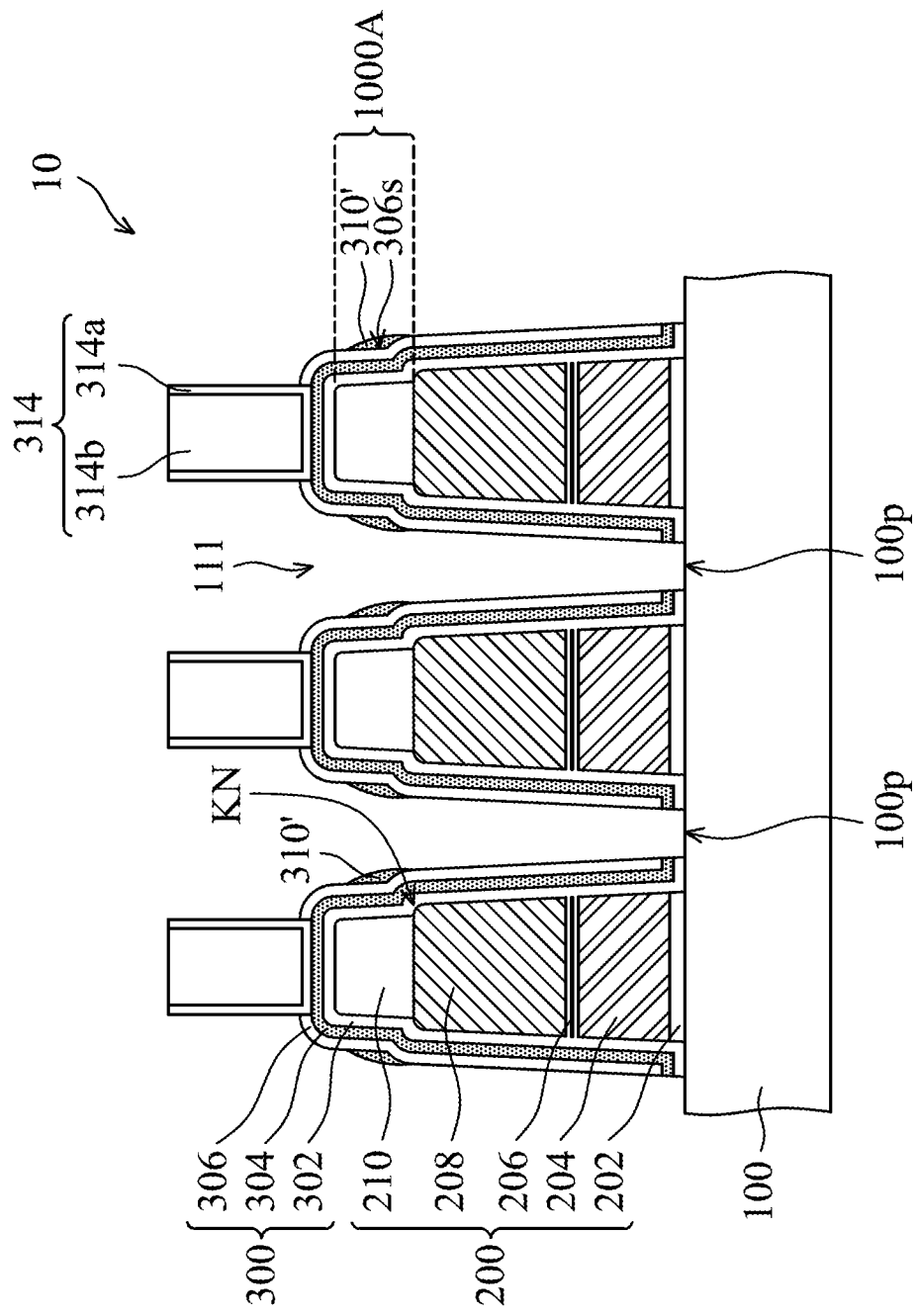

Next, referring to FIG. 1K and FIG. 1L, the first sacrificial layer 308 and the second sacrificial layer 408 may be removed (as shown in FIG. 1K), and portions of the lining layer 302, the first spacer layer 304 and the stop layer 306 may be removed (as shown in FIG. 1L) to form a plurality of contact openings 111 between the gate structures 200. In addition, the contact openings 111 may expose a part of the surface 100p of the substrate 100, for example, a part of the top surface. Specifically, as shown in FIG. 1K, in some embodiments, substantially all of the first sacrificial layer 308 and the second sacrificial layer 408 may be removed first to expose the sidewall 110s and the bottoms 110b of the trenches 110 again. As shown in FIG. 1L, in some embodiments, the lining layer 302, the first spacer layer 304 and the stop layer 306 that are located at the bottoms 110b of the trenches 110 then may be removed to form the contact openings 111.

In accordance with some embodiments, the step of removing the first sacrificial layer 308 and the second sacrificial layer 408 (as shown in FIG. 1K) and the step of removing the lining layer 302, the first spacer layer 304 and the stop layer 306 at the bottoms 110b of the trenches 110 (as shown in FIG. 1L) may be performed simultaneously (i.e. performed in one step). However, in accordance with some other embodiments, the step of removing the first sacrificial layer 308 and the second sacrificial layer 408 and the step of removing the lining layer 302, the first spacer layer 304 and the stop layer 306 at the bottoms 110b of the trenches 110 also may be performed separately.

In some embodiments, the first sacrificial layer 308 and the second sacrificial layer 408, and the lining layer 302, the first spacer layer 304 and the stop layer 306 located at the bottoms of the trenches 110 may be removed using a dry etching process.

In addition, in some embodiments, the foregoing steps of removing the first sacrificial layer 308 and the second sacrificial layer 408, and removing portions of the lining layer 302, the first spacer layer 304 and the stop layer 306 may also remove a portion of the remaining second spacer layer 310' at the same time. It should be noted that the remaining second spacer layer 310' can protect the spacer structure 300 of the gate structure 200 and prevent the etching process for forming the contact openings 111 from excessively damaging the spacer structure 300, thereby reducing the risk of exposing the shoulder portions KN of the gate structures 200.

Figure 1M:
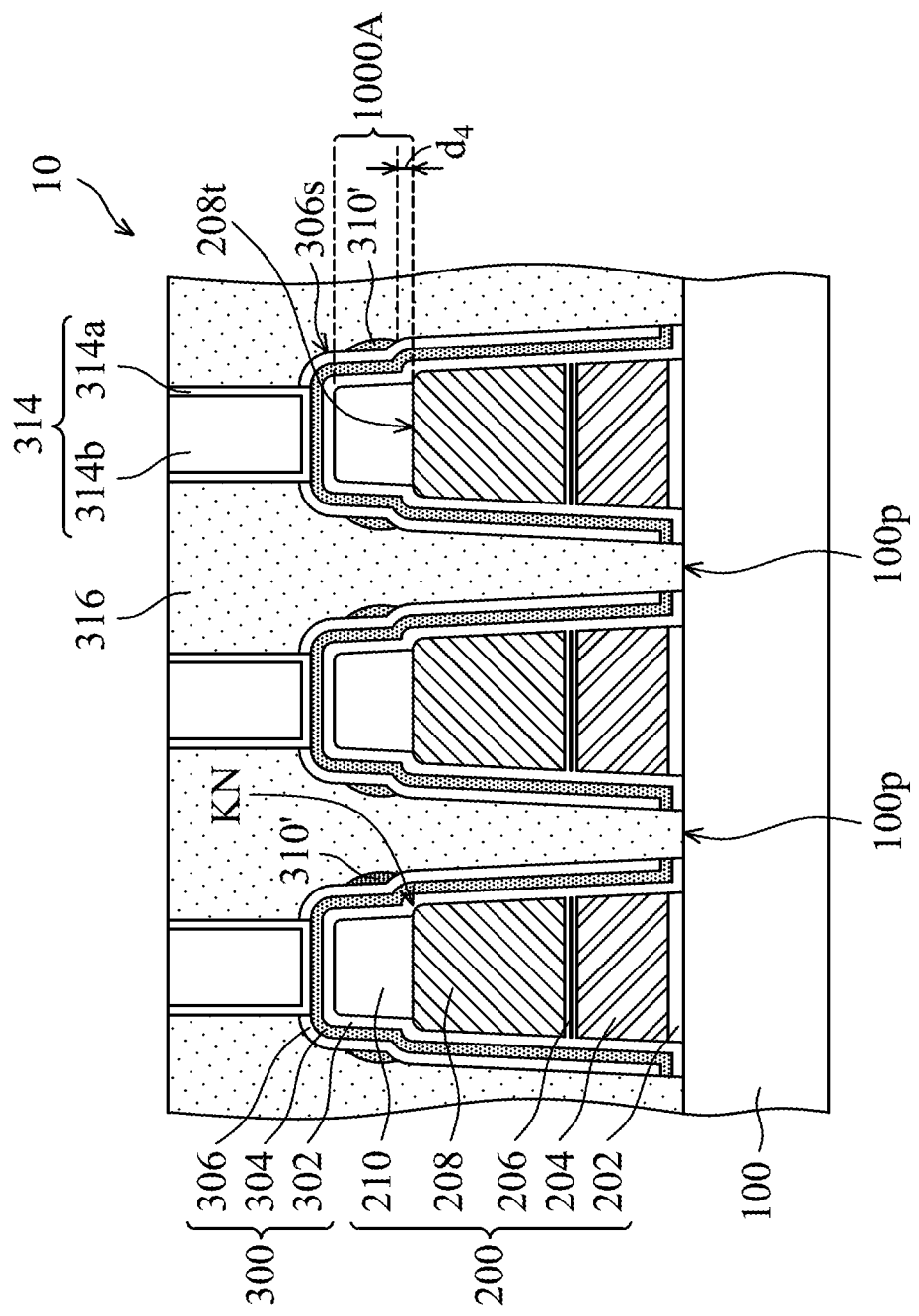

Next, referring to FIG. 1M, a conductive material may be filled in the contact openings 111 to form a plurality of contact plugs 316. In some embodiments, the contact plug 316 may be a self-aligned contact. In some embodiments, the conductive material may be completely filled in the contact openings 111 and formed between the dielectric plugs 314.

In some embodiments, the conductive material forming the contact plug 316 may include metal, polycrystalline silicon, other suitable materials, or a combination thereof In some embodiments, the metal may include tungsten (W), copper (Cu), aluminum (Al), gold (Au), silver (Ag), titanium (Ti), molybdenum (Mo), nickel (Ni), tungsten alloy, copper alloy, aluminum alloy, gold alloy, silver alloy, titanium alloy, molybdenum alloy, nickel alloy, other suitable metal materials, or a combination thereof.

Then, the manufacture of the semiconductor structure 10 may be substantially completed. Specifically, as shown in FIG. 1M, the semiconductor structure 10 may include the substrate 100, the gate structure 200, the lining layer 302, the first spacer layer 304, the stop layer 306, the second spacer layer 310', and the contact plug 316. The gate structure 200 may be located on the substrate 100. The lining layer 302 may be located on the gate structure 200. The first spacer layer 304 may be located on the lining layer 302. The stop layer 306 may be located on the first spacer layer 304, and the second spacer layer 310' may be located between the upper portions 1000A of the gate structures 200, and the contact plug 316 may be located between the gate structures 200. In some embodiments, the dielectric plug 314 may be located above the gate structure 200.

Specifically, in some embodiments, the lining layer 302 may conformally cover the gate structure 200, the first spacer layer 304 may conformally cover the lining layer 302 compliantly, and the stop layer 306 may conformally cover the first spacer layer 304. In some embodiments, the second spacer layer 310' may be located on the side surface 306s of the stop layer 306. Furthermore, in some embodiments, the second spacer layer 310' may be located on both sides of the upper portion 1000A of the gate structure 200. Further, in some embodiments, the contact plug 316 may be in contact with the second spacer layer 310' and the stop layer 306 at the same time.

In some embodiments, the second spacer layer 310' may be higher than the top surface 208t of the conductive layer 208 of the gate structure 200. Moreover, in some embodiments, the lowest position of the second spacer layer 310' may be higher than the top surface 208t of the conductive layer 208. In some embodiments, the second spacer layer 310' may be separated from the top surface 208t of the conductive layer 208 by a fourth distance $d_4$. In some embodiments, the fourth distance $d_4$ may be in a range from 250 Å to 50 Å.

To summarize the above, in accordance with some embodiments of the present disclosure, the method for forming a semiconductor structure includes forming an additional spacer layer on both sides of the shoulder portion (or surround the shoulder portion) of the gate structure, thereby further protecting the spacer structure of the gate structure. The amount of the spacer structure that is lost due to the etching process can be reduced and the risk of exposing the shoulder portion of the gate structure may be reduced. The problems such as word line leakage, bit line leakage or short-circuits thereby can be improved.

What is claimed is:

1. A method for manufacturing a semiconductor structure, comprising:
   providing a substrate;
   forming a plurality of gate structures on the substrate;
   forming a lining layer on the substrate and the plurality of gate structures;
   forming a first spacer layer on the lining layer;
   forming a stop layer on the first spacer layer;
   forming a first sacrificial layer on the stop layer and between the plurality of gate structures;
   removing a portion of the first sacrificial layer so that a top surface of the first sacrificial layer is located between upper portions of the plurality of gate structures;
   forming a second spacer layer on the first sacrificial layer and the plurality of gate structures;
   removing a portion of the second spacer layer so that the remaining second spacer layer is located between the upper portions of the plurality of gate structures;
   forming a second sacrificial layer on the plurality of gate structures and between the plurality of gate structures;
   removing the first sacrificial layer and the second sacrificial layer, and removing portions of the lining layer, the first spacer layer and the stop layer to form a plurality of contact openings between the plurality of gate structures, wherein the plurality of contact openings expose a part of the surface of the substrate; and
   filling a conductive material into the plurality of contact openings to form a plurality of contact plugs.

2. The method for manufacturing a semiconductor structure as claimed in claim 1, wherein after removing the portion of the second spacer layer, the remaining second spacer layer is located on a side surface of the stop layer.

3. The method for manufacturing a semiconductor structure as claimed in claim 1, wherein the upper portions of the plurality of gate structures comprises a gate masking layer.

4. The method for manufacturing a semiconductor structure as claimed in claim 3, wherein after removing the portion of the first spacer layer, the distance between the top surface of the first sacrificial layer and a bottom surface of the gate masking layer is in a range from 250 Å to 50 Å.

5. The method for manufacturing a semiconductor structure as claimed in claim 1, wherein the plurality of gate structures comprises a shoulder portion, and after removing the portion of the first spacer layer, the top surface of the first sacrificial layer is higher than the shoulder portion.

6. The method for manufacturing a semiconductor structure as claimed in claim 1, wherein the step of removing the first sacrificial layer and the second sacrificial layer and the step of removing portions of the lining layer, the first spacer layer and the stop layer are performed simultaneously.

7. The method for manufacturing a semiconductor structure as claimed in claim 1, wherein the step of removing the first sacrificial layer and the second sacrificial layer and the step of removing portions of the lining layer, the first spacer layer and the stop layer are performed separately.

8. The method for manufacturing a semiconductor structure as claimed in claim 1, wherein after forming the second sacrificial layer on the plurality of gate structures and between the plurality of gate structures, the method further comprises:
   forming a mask layer on the second sacrificial layer; and
   patterning the mask layer to remove portions of mask layer that are located above the plurality of gate structures.

9. The method for manufacturing a semiconductor structure as claimed in claim 1, wherein a portion of the remaining second spacer layer is also removed in the steps of removing the first sacrificial layer and the second sacrificial layer, and removing portions of the lining layer, the first spacer layer and the stop layer.

10. The method for manufacturing a semiconductor structure as claimed in claim 1, wherein after forming the second sacrificial layer on the plurality of gate structures and between the plurality of gate structures, the method further comprises:
forming a plurality of dielectric plugs on the plurality of gate structures, wherein the plurality of dielectric plugs penetrate through portions of the second sacrificial layer that are located above the plurality of gate structures.

11. A semiconductor structure, comprising:
a substrate;
a plurality of gate structures located on the substrate;
a lining layer located on the plurality of gate structures;
a first spacer layer located on the lining layer;
a stop layer located on the first spacer layer;
a second spacer layer located between upper portions of the plurality of gate structures; and
a plurality of contact plugs located between the plurality of gate structures.

12. The semiconductor device as claimed in claim 11, wherein the second spacer layer is located on a side surface of the stop layer.

13. The semiconductor device as claimed in claim 11, wherein the second spacer layer is located on both sides of the upper portions of the plurality of gate structures.

14. The semiconductor device as claimed in claim 11, wherein the plurality of contact plugs are in contact with the second spacer layer and the stop layer.

15. The semiconductor device as claimed in claim 11, wherein the plurality of gate structures comprises a conductive layer, wherein the second spacer layer is higher than a top surface of the conductive layer.

16. The semiconductor device as claimed in claim 15, wherein the distance between the second spacer layer and the top surface of the conductive layer is in a range from 250 Å to 50 Å.

17. The semiconductor device as claimed in claim 11, further comprising:
a plurality of contact plugs located above the plurality of gate structures.

18. The semiconductor device as claimed in claim 11, wherein the material of the stop layer comprises silicon oxide.

19. The semiconductor device as claimed in claim 11, wherein the material of the first spacer layer and the second spacer layer comprises silicon nitride, silicon oxynitride, or a combination thereof.

20. The semiconductor device as claimed in claim 11, wherein the material of the lining layer comprises silicon oxide.

* * * * *